(12) United States Patent
Spurgeon et al.

(10) Patent No.: US 8,222,123 B2
(45) Date of Patent: Jul. 17, 2012

(54) METHOD FOR REUSE OF WAFERS FOR GROWTH OF VERTICALLY-ALIGNED WIRE ARRAYS

(75) Inventors: Joshua M. Spurgeon, Pasadena, CA (US); Katherine E. Plass, Lancaster, PA (US); Nathan S. Lewis, La Canada, CA (US); Harry A. Atwater, S. Pasadena, CA (US)

(73) Assignee: The California Institute of Technology, Pasadena, CA (US)

( * ) Notice: Subject to any disclaimer, the term of this patent is extended or adjusted under 35 U.S.C. 154(b) by 0 days.

(21) Appl. No.: 13/053,090

(22) Filed: Mar. 21, 2011

(65) Prior Publication Data

US 2012/0028420 A1    Feb. 2, 2012

Related U.S. Application Data

(63) Continuation of application No. 12/176,100, filed on Jul. 18, 2008, now Pat. No. 7,910,461.

(60) Provisional application No. 61/127,437, filed on May 13, 2008, provisional application No. 60/966,432, filed on Aug. 28, 2007.

(51) Int. Cl.
*H01L 21/36* (2006.01)
*H01L 21/20* (2006.01)
*H01L 21/00* (2006.01)
*H01L 29/00* (2006.01)

(52) U.S. Cl. .... 438/478; 438/503; 438/962; 257/E21.09

(58) Field of Classification Search ............... 438/478, 438/503, 962; 257/E21.09
See application file for complete search history.

(56) References Cited

U.S. PATENT DOCUMENTS 7,259,324 B2 * 8/2007 Zeira ........................ 136/263
7,998,788 B2 * 8/2011 Guha et al. ................ 438/99

* cited by examiner

*Primary Examiner* — Luan C Thai
(74) *Attorney, Agent, or Firm* — Joseph R. Baker, Jr.; Gavrilovich Dodd & Lindsey LLP

(57) ABSTRACT

Reusing a Si wafer for the formation of wire arrays by transferring the wire arrays to a polymer matrix, reusing a patterned oxide for several array growths, and finally polishing and reoxidizing the wafer surface and reapplying the patterned oxide.

8 Claims, 6 Drawing Sheets

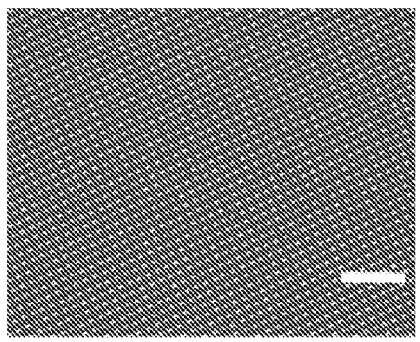 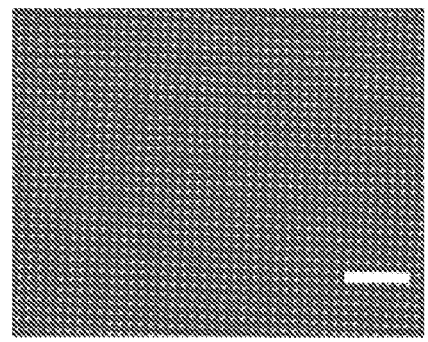
FIG. 5A　　　　　　　　　　FIG. 5B
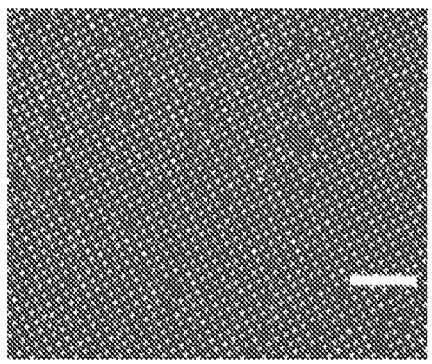 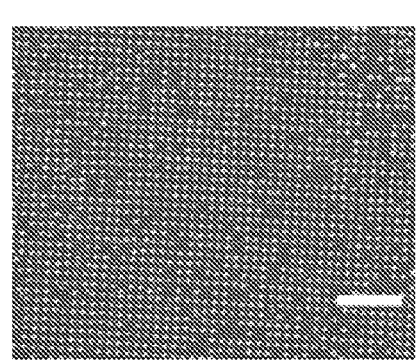
FIG. 5C　　　　　　　　　　FIG. 5D
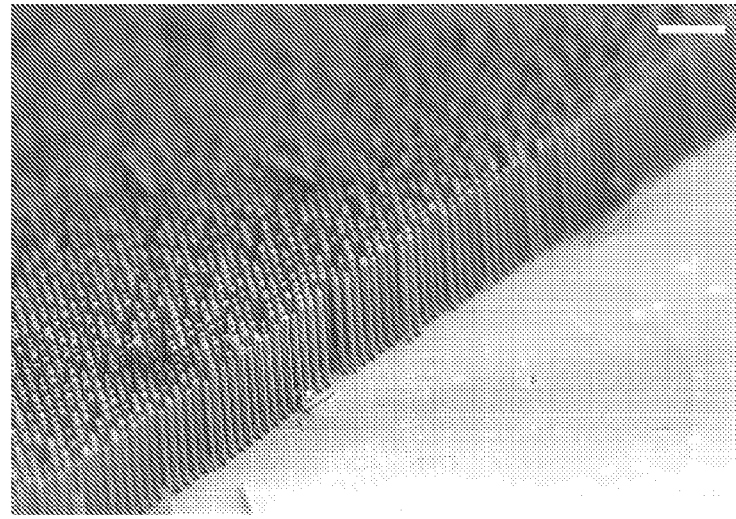
FIG. 6

METHOD FOR REUSE OF WAFERS FOR GROWTH OF VERTICALLY-ALIGNED WIRE ARRAYS

CROSS-REFERENCE TO RELATED APPLICATIONS

The present application is a continuation of U.S. patent application Ser. No. 12/176,100, filed Jul. 18, 2008 (now U.S. Pat. No. 7,910,461), which application is related to an claims the benefit of the following copending and commonly assigned U.S. patent applications: U.S. Patent Application No. 61/127,437, titled "Regrowth of Silicon Rod Arrays," filed on May 13, 2008; and U.S. Patent Application No. 60/966,432, titled "Polymer-embedded Semiconductor Rad Arrays," filed on Aug. 28, 2007; the entire contents of these applications are incorporated herein by reference.

STATEMENT REGARDING FEDERALLY SPONSORED RESEARCH OR DEVELOPMENT

The U.S. Government has certain rights in this invention pursuant to Grant No. DE-FG02-03ER15483 awarded by DOE.

BACKGROUND

1. Field

This disclosure relates to fabrication of semiconductor structures on substrates. More specifically, the present disclosure describes methods for growing semiconductor structures on substrates and reusing the substrates.

2. Description of Related Art

The following commonly assigned and copending applications describe the growth of vertically aligned Si wire arrays on a substrate: "U.S. Patent Application No. 60/961,170, titled "Fabrication of Wire Array Samples and Controls," filed on Jul. 19, 2007; U.S. Patent Application No. 60/961,169, titled "Growth of Vertically Aligned Si Wire Arrays Over Large Areas (>1 cm$^2$) with Au and Cu Catalysts," filed on Jul. 19, 2007. These methods to grow high quality, vertically aligned arrays of Si wires may require an expensive, single crystal Si (111) wafer to be used as a substrate. This may hinder the potential of these wire arrays to be used as part of a cheaper alternative to traditional, planar junction solar cells.

SUMMARY

The following copending and commonly assigned patent application describes methods for encapsulating semiconductor structures grown on a substrate within a binder material layer: U.S. Patent Application No. 60/966,432, titled "Polymer-embedded Semiconductor Rod Arrays," filed on Aug. 28, 2007. Embodiments of the present invention allow for the separation of semiconductor structures embedded in the binder material layer from the substrate and then reuse of the substrate for growth of additional semiconductor structures. Through the reuse of the substrate, the expense of the wafer can be reduced within the overall process.

One embodiment of the present invention is a method for fabricating semiconductor structures comprising the steps of: (a) fabricating semiconductor structures on a substrate; (b) encapsulating the fabricated semiconductor structures in a binder material matrix; (c) releasing the fabricated semiconductor structures from the substrate; and (d) reusing the substrate for fabricating additional semiconductor structures by repeating steps (a) through (c).

Another embodiment of the present invention is a method for fabricating set of Si wire arrays comprising the following steps: growing Si wire arrays on a single crystal Si wafer using a patterned oxide layer deposited on the Si wafer; transferring the grown Si wire arrays to a binder material matrix; removing binder material residue and wire array remnants from the Si wafer; and reusing the Si wafer for fabricating additional Si wire arrays by repeating the steps of growing Si wire arrays, transferring the grown Si wire arrays to a binder material matrix, and removing binder material residue and wire array remnants.

Another embodiment of the present invention is a method for reusing a substrate for semiconductor structure fabrication comprising: growing semiconductor structures on a substrate using a patterned oxide layer deposited on the substrate, wherein the patterned oxide layer accepts the deposition of catalyst metal into openings in the patterned oxide layer to support growth of the semiconductor structures; transferring the grown semiconductor structures to a binder material matrix; removing binder material residue and semiconductor structure remnants from the substrate; and reusing the substrate for fabricating additional semiconductor structures by repeating the steps of growing semiconductor structures; transferring the grown semiconductor structures to a binder material matrix, and removing binder material residue and semiconductor structure remnants.

No limitation is intended by the description of exemplary embodiments briefly described above or those described in additional detail below.

BRIEF DESCRIPTION OF THE SEVERAL VIEWS OF THE DRAWINGS

FIGS. 5A-5D are SEM images of wire arrays achieved through four generations of a method for reusing a Si wafer for wire array growth.

FIG. 6 shows a tilted view SEM image of a Si wire array grown from a Si(111) wafer that has been mechanically polished and then thermally oxidized.

DETAILED DESCRIPTION

Figure 1A:
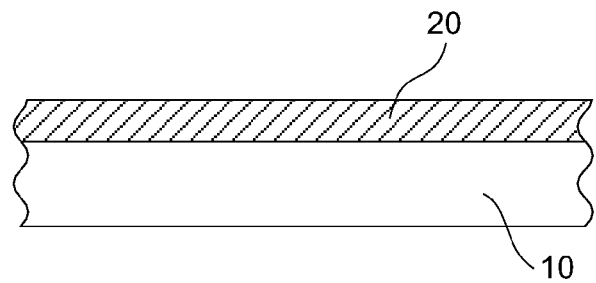
FIGS. 1A-1G illustrate steps for growing vertically aligned Si wire arrays on a Si substrate.

Within this description, the terms "wires," "rods," "whiskers," and "pillars" and other similar terms may be used synonymously, except as otherwise indicated. Generally, these terms refer to elongate structures which have lengths and widths, where the length is defined by the longest axis of the structure and the width is defined by the axis generally normal to the longest axis of the structure. The term 'aspect ratio' refers to the ratio of a structure's length to its width. Hence, the aspect ratios of the elongate structures will greater than one. The terms "ball," "spheroid," "blob" and other similar terms may also be used synonymously, except as otherwise indicated. Generally, these terms refer to structures with the width defined by the longest axis of the structure and the length defined by the axis generally normal to the width. Hence, the aspect ratio of such structures will generally be unity or less than unity. Further the term "vertical" with reference to wires, rods, whiskers, pillars, etc., generally refers to structures that have a length direction that is elevated somewhat from horizontal. The term "vertical alignment" generally refers to an alignment or orientation of a structure or structures that is elevated from horizontal. The structure or structures do not have to be completely normal to horizontal to be considered to have a vertical alignment. The term "array" generally refers to multiple numbers of structures distributed within an area and spaced apart, unless otherwise indicated. Structures within an array all do not have to have the same orientation. The terms "vertically aligned array" or "vertically oriented array" generally refer to arrays of structures where the structures have orientations elevated from a horizontal orientation up to orientations completely normal to a horizontal orientation, but the structures within the array may or may not have all the same orientations with respect to horizontal. The term "ordered" generally refers to the placement of elements in a specified or predetermined pattern where the elements have distinct spatial relationships to one another. Hence, the term "ordered array" generally refers to structures distributed within an area with distinct, specified or predetermined spatial relationships to one another. For example, the spatial relationships within an ordered array may be such that the structures are spaced apart from one another by generally equal distances. Other ordered arrays may use varying, but specified or predetermined, spacings.

Within this description, the term "semiconductor" is generally used to refer to elements, structures, or devices, etc. comprising materials that have semiconductive properties, unless otherwise indicated. Such materials include, but are not limited to: elements from Group IV of the periodic table: materials including elements from Group IV of the period table; materials including elements from Group III and Group V of the periodic table; materials including elements from Group II and Group VI of the periodic table; materials including elements from Group I and Group VII of the periodic table; materials including elements from Group IV and Group VI of the periodic table; materials including elements from Group V and Group VI of the periodic table; and materials including elements from Group II and Group V of the periodic table. Other materials with semiconductive properties may include: layered semiconductors; metallic alloys; miscellaneous oxides; some organic materials, and some magnetic materials. The term "semiconductor structure" refers to a structure consisting of, at least in part, semiconductor material. A semiconductor structure may comprise either doped or undoped material.

As indicated, methods to fabricate semiconductor structures on a substrate may require an expensive, single crystal Si (111) wafer be used as the substrate. This hinders the potential of these structures to be used as part of cheaper alternatives for complex semiconductor devices, such as solar cells to be used in place of traditional planar junction solar cells. However, by separating the substrate from the semiconductor structures and reusing it for subsequent semiconductor structure fabrication, the expense of the wafer can be reduced within the overall process. The present disclosure describes the fabrication of multiple, high quality semiconductor structures from a given Si (111) wafer. As an example, fabrication of vertically-aligned Si wire arrays from a Si wafer substrate is described. Before removing it from the substrate, the wire array is embedded in polymer to maintain its vertically aligned structure. An oxide template used to control the wire dimensions is then recovered by a selective etching step, and metal catalyst is electrodeposited back into the template holes to enable the growth of a new wire array. After several repetitions of this procedure, a new template may be formed by polishing and thermal oxidation so that the cycle can continue.

Embodiments of the present invention may use various methods for fabrication of semiconductor structures. Discussed immediately below is the fabrication of semiconductor structures using V-L-S growth techniques. However, the semiconductor structures may be deposited on the substrate, an example of which is presented below. The semiconductor structures may also be etched from the substrate, an example of which is also presented below. Embodiments of the present invention where the semiconductor structures are fabricated from etching the substrate provide for less opportunity to reuse the substrate, since the substrate is, to some extent, used up during the fabrication and reuse process. However, such top-down fabrication techniques are within the scope of embodiments of the present invention.

FIGS. 1A-1G illustrate a process for growing semiconductor structures using a vapor-liquid-solid (VLS) growth process. FIGS. 1A-1G specifically illustrate the growth of Si wire arrays. Other techniques for growing the semiconductor structures may also be used in accordance with embodiments of the present invention. Therefore, embodiments of the present invention are not limited to the semiconductor structure fabrication techniques disclosed or described herein.

An Si <111> wafer may be used as the material from which the semiconductor structures are grown. All or portions of the wafer may be doped. For example, a degenerately doped N-type Si wafer may be used. As shown in FIG. 1A, a surface oxide layer 20 is thermally grown on the wafer 10. The surface oxide layer may be grown to a thickness of 285 nm, 300 nm, or other thicknesses. The oxide layer 20 may also be deposited via chemical vapor deposition (CVD) or other methods known in the art.

Figure 1B:
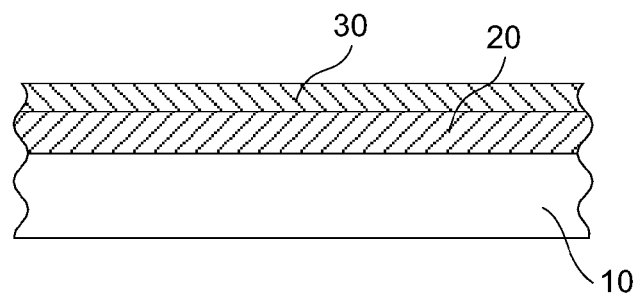
Figure 1C:
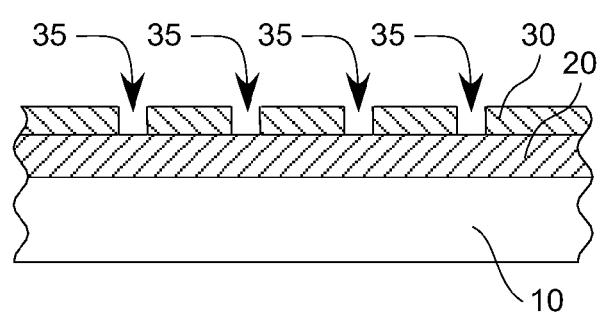
Figure 1D:
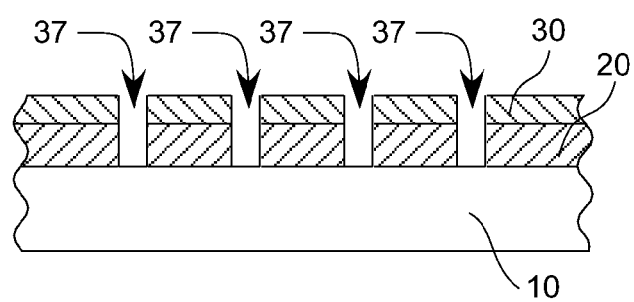

As shown in FIG. 1B, a photoresist layer 30 is applied. The photoresist layer may comprise S1813 photoresist from MicroChem Corp. (Newton, Mass., USA) or other photoresist material. The photoresist layer 30 is then exposed to a desired array pattern and developed with a developer to form a desired pattern of holes 35 in the resist layer 30 as shown in FIG. 1C. The developer may comprise MF-319 or other developers known in the art. The patterned resist layer 30 is then used to etch the oxide layer 20 on the Si wafer 10 as shown in FIG. 1D. Etching of the oxide layer may be achieved by using hydrofluoric acid compositions such as buffered HF (9% HF, 32% $NH_4F$) from Transene Company, Inc. (Danvers, Mass., USA). Other etching techniques known in the art may also be used to etch the oxide layer 20. The result of the etching will be a pattern of holes 37 in the oxide layer as shown in FIG. 1D.

Figure 1E:
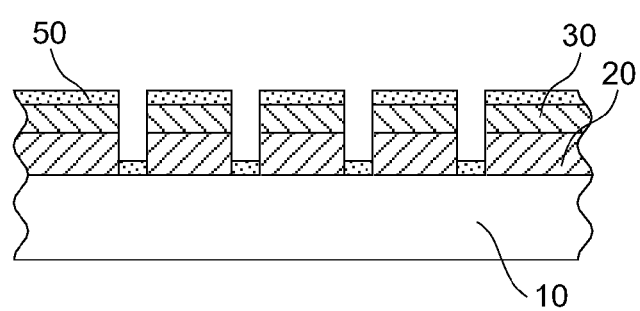
Figure 1F:
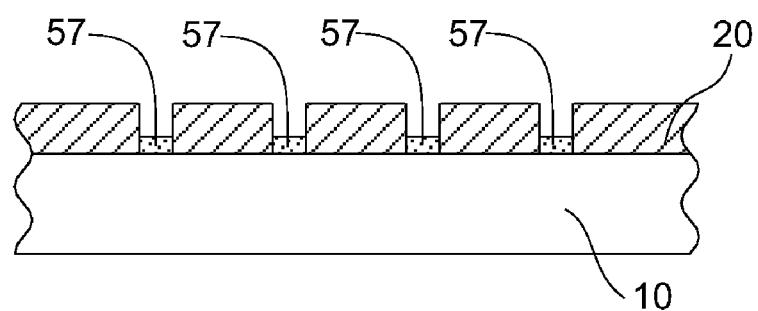

A growth catalyst 50 is then thermally evaporated onto the resist layer 30 and into the holes 37 in the oxide layer 20 as shown in FIG. 1E. For example, 500 nm of gold may be thermally evaporated onto the resist layer 30 and into the holes 37. Other catalysts, such as, but not limited to, Cu, Pt or Ni, may also be used. Lift-off of the photoresist layer 30 is then performed, leaving catalyst islands 57 separated by the oxide in the oxide layer 20 as shown in FIG. 1F.

Figure 1G:
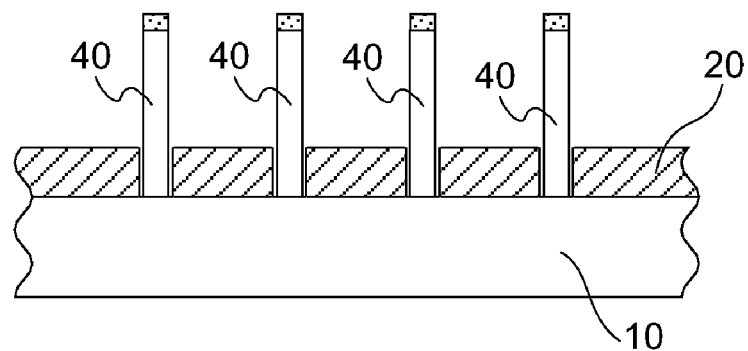

The wafer 10 with the patterned oxide layer 20 and the deposited catalyst may then be annealed. Preferably, the annealing is performed in a tube furnace at a temperature between 900 to 1000° C. or at a temperature of about 1050° C. for 20 minutes with the application of 1 atm of $H_2$ at a flow rate of 1000 sccm (where SCCM denotes cubic centimeters per minute at STP). Growth of wires on the wafer 10 is then performed. FIG. 1G shows the growth of wires 40 in a wire array through the application of a growth gas. Preferably, the wires 40 are grown in a mixture of $H_2$ (1000 sccm) and $SiCl_4$ (20 sccm) at about 1 atm. The wires 40 may be grown for between 20 to 30 minutes at temperatures between 850° C. to 1100° C. or with different growth times, pressures, and or flow rates.

Figure 2A:
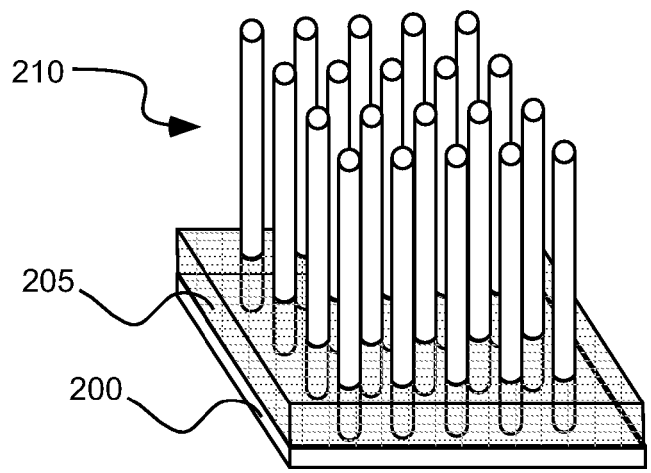
FIGS. 2A-2C illustrate steps for embedding and removing semiconductor structures from a substrate.
Figure 2B:
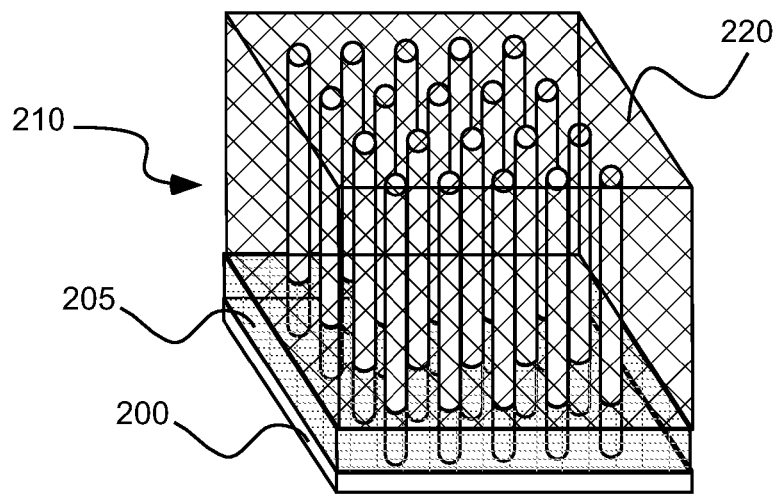
Figure 2C:
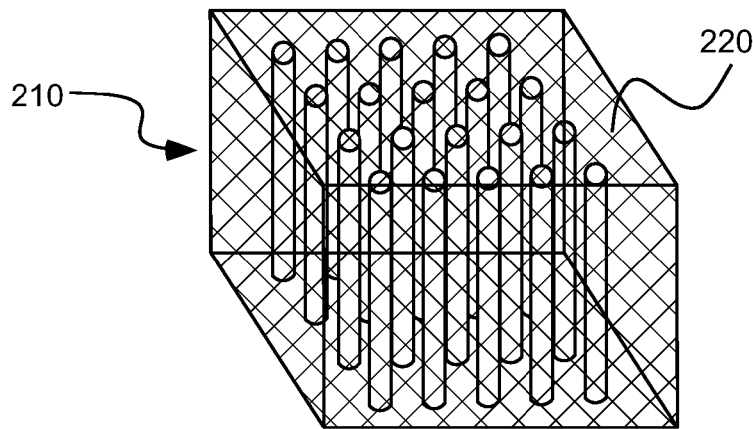

After the fabrication of the semiconductor structures, binder material is applied to encapsulate the semiconductor structures grown on the substrate and then the removal of the encapsulated structures embedded in the binder material layer. FIGS. 2A-2C illustrate the application and removal process. FIG. 2A shows a substrate 200 with an oxide layer 205 above the substrate and with semiconductor rod arrays 210 projecting from the substrate 200 and an oxide layer 205. FIG. 2B shows the application of a binder material 220 to the substrate 200 and oxide layer 205 and around the semiconductor rod arrays 210. FIG. 2C shows the structure obtained when the binder material 220 with the embedded rod arrays 210 are removed from the substrate 200 and oxide layer 205. As indicated above, semiconductor structures other than semiconductor rod arrays may be embedded within a binder material layer. Note also that the substrate 200 and the oxide layer 205 may each comprise one or more layers.

The binder material may comprise polydimethylsiloxane (PDMS) polymer. The polydimethylsiloxane base may comprise Sylgard 184 PDMS from Dow Corning or other such materials. The polymer base and curing agent are mixed in a 10:1 w/w ratio and stirred. The uncured polymer is diluted with methylene chloride (1.0 g/2.0 mL) and drop-cast on the semiconductor rod arrays such that a smooth polymer surface is preferably observed. These arrays are then allowed to sit for some time to allow slow evaporation of the methylene chloride. After 13-16 hours the PDMS is still tacky, and is cured by heating to 120° C. for 1.5-2.0 hours. After cooling, the PDMS overlayer and embedded rods are removed from the substrate and oxide layer using a cutting device, such as scraping the oxide layer with a razor blade. The resulting polymer film has the semiconductor rod arrays embedded with the same ordering as observed on the substrate.

Figure 3A:
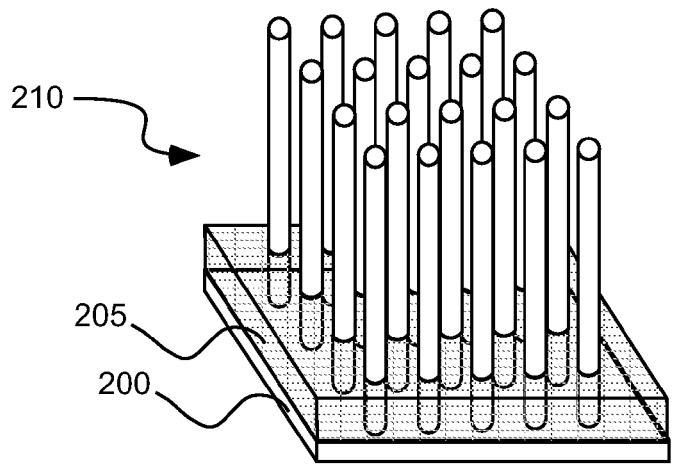
FIGS. 3A-3C illustrate steps for embedding and removing semiconductor structures from a substrate when the semiconductor structures are not completely encapsulated.
Figure 3B:
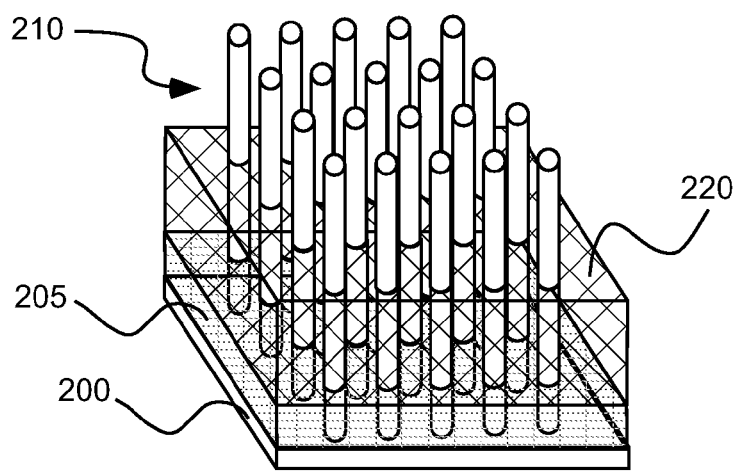
Figure 3C:
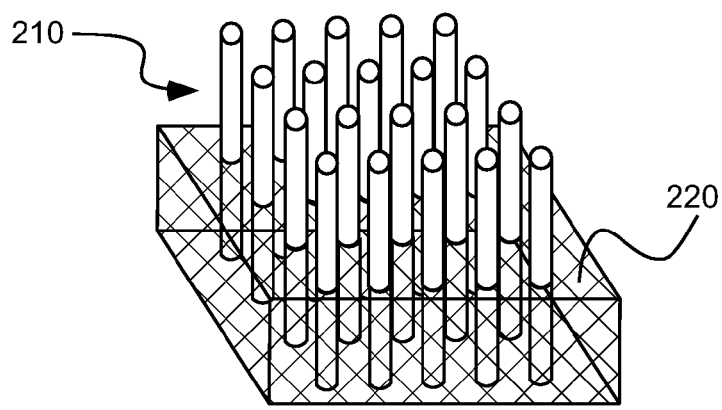

The method described above may provide for electrical contact to the bottom ends of the semiconductor rod arrays 40 (the ends which were previously connected to the substrate), but the top ends of the rod arrays may be covered by the polymer, making electrical contact to those ends more difficult. In an alternative method of binder material application, a thinner binder material layer is applied to the substrate and around the semiconductor rod arrays. FIGS. 3A-3C illustrate this method of application.

FIG. 3A shows a substrate 200 with an oxide layer 205 above the substrate 205 and with semiconductor rod arrays 210 projecting from the substrate 200 and oxide layer 205. FIG. 3B shows the application of a binder material layer 225 to a top surface of the oxide layer 205 above substrate 200 and around the semiconductor rod arrays 210, but at a thickness less than the height of the rod arrays. FIG. 3C shows the structure obtained when the binder material 225 with the embedded rod arrays 210 projecting from the binder material 225 are removed from the substrate 200 and oxide layer 205.

In the alternative method described above, spin casting may be used to apply the binder material. For example, the polymer base and curing agent mix described above may be diluted with a solution of hexamethylcyclotrisiloxane (Alfa Aesar, 97%, nearly saturated in methylene chloride), where the preferred dilution ratio may be four parts hexamethylcyclotrisiloxane to one part of the polymer and curing agent mix. To produce a thinner film, the low-boiling-point siloxane was added to the PDMS solution that is used to form the polymer/rod array composite. The diluted mixture is then spin-cast on the rod arrays at 1000 rpm for 2 min. After spin-coating, the methylene chloride rapidly evaporates, and the samples are cured at 150° C. for 0.5 hours. The low-boiling-point siloxane evaporated significantly during the curing step, resulting in 20 μm thick polymer films in which greater than 50% of the wires were exposed. After curing and cooling, the PDMS overlayer and embedded rods are again removed from the substrate and oxide layer using a cutting device.

Figure 4A:
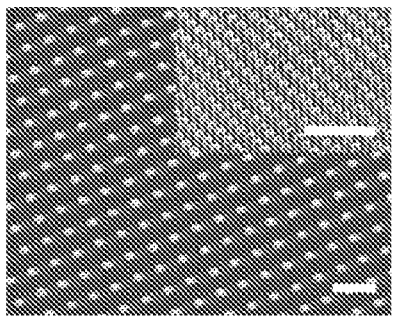
FIGS. 4A-4F are SEM images showing the results of various steps of a method for reusing a substrate for semiconductor structure growth.
Figure 4D:
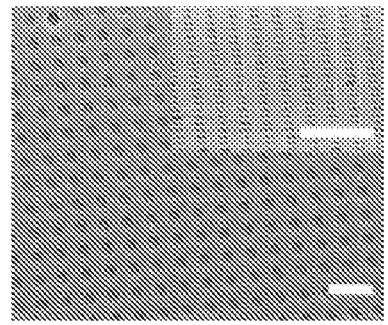
Figure 4B:
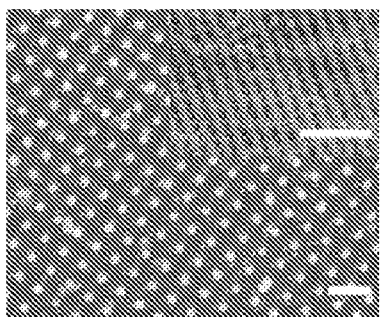
Figure 4E:
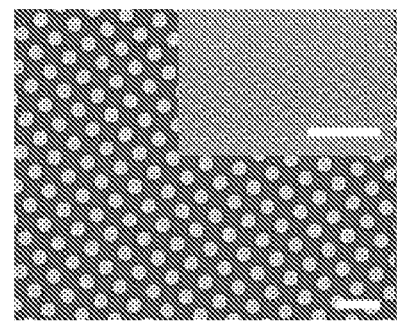
Figure 4C:
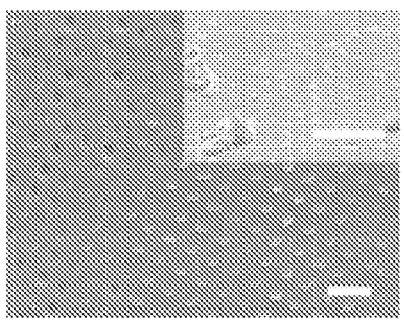

FIG. 4A is a SEM image of a wire array grown on a substrate using the methods described above, where the majority of the image is a top-down view of the wire array with a 10 μm scale and the inset is a 70° tilted view of the wire array with a 20 μm scale. FIG. 4B is a top down SEM image (with the same scale as FIG. 4A) of a removed binder material layer with embedded rod arrays (the inset in FIG. 4B shows a 70° tilted image). FIG. 4C is a top-down SEM image (with the same scale as FIG. 4A) of the substrate surface left behind after the removal of the binder material layer (the inset in FIG. 4C shows a 70° tilted image). In particular, FIG. 4C shows the wire stubs and polymer residue left after the removal of the binder material layer and the embedded wire arrays.

Reuse of the substrate for subsequent semiconductor growth may be initiated by etching the substrate after the removal of the binder material layer to remove any semiconductor structure remnants and polymer residue. For example, if a Si wafer has been used for the growth of Si wire arrays, a KOH etch may be used to prime wafer surface for wire growth. The etching may be achieved by immersing the wafers for 90 seconds in a 4.5 M KOH (aq) etchant maintained at 80° C. under stirring. Preferably, the wafer is examined using an optical microscope to ensure that the polymer residue and wire stubs have been fully removed. FIG. 4D shows a top-down SEM image of a wafer after a KOH etch (the inset in FIG. 4D shows a 70° tilted image). If necessary, the wafer may be reimmersed in the etchant until no residue or wire stubs remain. Experimentation indicates that the wafer surface can be cleaned by immersion in the etchant for 120 seconds or less. Etching in this manner should leave in place the patterned oxide layer that will be used as a template for subsequent array growth.

Alternative embodiments of the present invention may not have a step for the removal of semiconductor structure remnants and/or polymer residue after the removal of the binder matrix and embedded semiconductor structures. That is, the remnants and/or residue may be left in place if subsequent fabrication steps do not require or are not impacted by the presence of the remnants and/or residue. The absence of such a etching or cleaning step may speed the preparation of the substrate for subsequent semiconductor fabrication.

After the semiconductor structure remnants and polymer residue have been removed (if needed or desired), catalyst metal may be reapplied to facilitate the growth of new semiconductor structures. Electrodeposition may be used for the reapplication of the catalyst metal. To initiate reapplication of the catalyst metal, the substrate should be prepared for electrodeposition. For example, if a Si wafer has been cleaned as described above, it may then be placed with its oxide side down while buffered HF (aq) is applied to the back side of the wafer for 5 minutes. Application of the HF to the back side of the wafer provides for the removal of any oxide from that side of the wafer. However, care must be taken to ensure that no HF contacts the oxide side of the wafer, since that may damage the patterned oxide layer.

After the substrate has been prepared for electrodeposition, electrical contacts should be formed to facilitate the electrodeposition. After any oxide has been removed from the back side of the Si wafer, the back side may be rinsed with 18 MΩ resistivity $H_2O$ and dried under a stream of $N_2$ gas. A piece of two-sided conductive Cu tape may then be applied to the back side of the wafer. This assembly can be made into an electrode by connecting the other side of the Cu tape to a Cu wire in a glass tube and using mounting wax to seal the tube and cover the wafer so that only the patterned oxide layer on the front is exposed. This electrode may then be dipped in 10% (by volume) HF (aq) for 10 s to remove the native oxide at the bottom of patterned holes within the patterned oxide layer on the substrate and then rinsed thoroughly in water.

After the electrical contacts to support electrodeposition have been formed and the substrate finally prepped for the application of catalyst metal, the electrodeposition may be started. After the Si wafer electrode has been formed and prepped as described above, the electrode may then be immediately transferred to a catalyst metal electrodeposition bath, such as an Au electrodeposition bath (for example, Orotemp 24 from Technic Inc.). If Au metal is used, the Au metal may be deposited into the patterned holes by setting a constant current density of 0.4 to 0.8 mA $cm^{-2}$ of exposed wafer area between the Si working electrode and a Pt gauze counterelectrode and allowing it to proceed galvanostatically until 0.12 C $cm^{-2}$ of charge has passed. Of course, alternative embodiments may deposit more or less Au, depending upon the desired diameters of the Si wires to be grown. A Princeton Applied Research Model 173 potentiostat may be used to make the charge measurement. The wafer with metal catalyst deposits in the patterned holes may then be removed from the electrode assembly by thoroughly dissolving the mounting wax in acetone. This should be done before the next set of semiconductor structures are grown, as discussed below. FIG. 4E shows a top-down SEM image of a reconditioned wafer after electrodeposition of an Au catalyst (the inset in FIG. 4E shows a 70° tilted image).

Figure 4F:
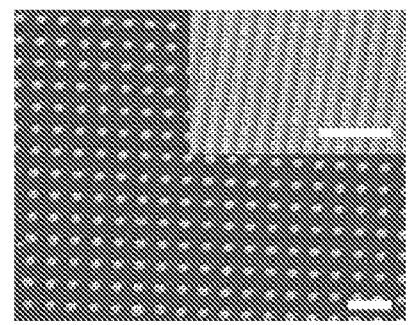

After the deposition of the catalyst metal, the second generation semiconductor structures can be grown using the same technique as that used for the first generation structures. Returning to the Si wafer example, the V-L-S technique described above and illustrated in FIGS. 1A-1G can be used to form a second set of wire arrays, which can then be encapsulated and removed as described above. FIG. 4F shows a top-down SEM image of a reconditioned wafer after a new wire array has been grown (the inset in FIG. 4F shows a 70° tilted image). Subsequent polymer casting and peeling, patterned surface regeneration, metal catalyst electrodeposition, and wire regrowth stages may be repeated to fabricate a third and fourth generation (or more) of wire arrays on the same set of Si wafers. FIGS. 5A-5D show the successive wire array generations obtained using the methods described above. FIG. 5A is a top-down SEM image of the first generation of wire arrays (the scale bar is 40 µm). FIG. 5B is a top-down SEM image of the second generation (the scale bar is 40 µm). FIG. 5C is a top-down SEM image of the third generation (the scale bar is 40 µm). FIG. 5D is a top-down SEM image of the fourth generation (the scale bar is 40 µm). Note that defect density increases with successive generations.

As indicated, fidelity of the oxide template pattern may break down, so the substrate may be additionally prepared for reuse through mechanically polishing or other techniques to remove the oxide layer and prepare the substrate for the application of a new patterned oxide layer. For example, the Si wafers used to fabricate successive generations of wire arrays may be prepared to start the cycle again by subjecting them to mechanical polishing followed by thermal oxidation. A wafer may be mounted with wax onto a polishing chuck, and its surface was smoothened by employing a South Bay Technology polishing wheel. It can be successively exposed to 1200 grit SiC paper, a 15 µm size alumina particle suspension, a 1 µm size alumina particle suspension, and a 0.3 µm size alumina particle suspension. The polished Si wafer may then be put into a tube furnace under a fully hydrated atmosphere of industrial grade air at 900° C. for 8 h, resulting in a surface oxide 300-400 nm thick. The Si wafer can then be photolithographically patterned to form the desired array pattern (other patterning techniques may be used), covered in an evaporated catalyst layer, subjected to lift-off, and put in a reactor under the same process conditions (as described above and shown in FIGS. 1A-1G) that were used to grow the first generation of Si wires on a new wafer. This reconditioned Si wafer can then be used to form additional generations of wire arrays as described above. FIG. 6 shows a tilted view SEM image of a Si wire array grown from a Si (111) wafer that has been mechanically polished and then thermally oxidized. The scale bar is 40 µm.

As indicated above, other methods may be used for the fabrication of semiconductor structures in accordance with embodiments of the present invention. For example, the semiconductor structures may be deposited on a substrate, rather than via a growth process. In such a case, transfer and release of the deposited semiconductor structures would be accomplished in much the same manner as described above. After the semiconductor structures are formed, a binder material layer would be deposited around the structures and the binder material layer with the embedded structures would be separated from the substrate. Still another semiconductor structure fabrication process using etching of the substrate would still provide the opportunity for substrate reuse. After the semiconductor structures are formed in the substrate by etching away portions of the substrate, a binder material layer would be deposited around the structures and the binder material layer with the embedded structures would be separated from the substrate. Of course, in this case, the fabrication of the structures results in loss of material from the substrate, limiting the amount of substrate reuse.

Although it has been possible to fabricate Si wires of ideal dimensions for photovoltaics into vertically aligned, exceptionally uniform arrays, an expensive single crystal wafer substrate has been necessary to date for each array in order to induce aligned, epitaxial growth. However, by transferring the wires to a polymer matrix, reusing the patterned oxide for several array growths, and finally polishing and reoxidation of the wafer surface to close the cycle, the cost of the substrate can be amortized across hundreds of wire arrays. Embodiments of the present invention may be employed with many different polymer materials, as well as with any surface-initiated semiconductor structure growth method.

The foregoing Detailed Description of exemplary and preferred embodiments is presented for purposes of illustration and disclosure in accordance with the requirements of the law. It is not intended to be exhaustive nor to limit the invention to the precise form or forms described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising step(s) for . . . "

What is claimed is:

1. A method for fabricating semiconductor structures comprising the steps of:
    (a) forming a templated oxide layer on a substrate, wherein the templated oxide layer comprises openings in the oxide layer for the formation of semiconductor structures;
    (b) depositing a catalyst in the openings in the oxide layer;
    (c) growing a set of semiconductor structures on the substrate, wherein the semiconductor structure growth is supported by the catalyst deposited in the openings in the oxide layer;
    (d) encapsulating the fabricated semiconductor structures in a binder material matrix;
    (e) releasing the fabricated semiconductor structures from the substrate; and
    (f) reusing the substrate for fabricating additional semiconductor structures by etching and cleaning the substrate and repeating steps (a) through (e).

2. The method according to claim 1, further comprising conditioning the substrate after performing steps (a) through (e) and before performing step (f).

3. The method according to claim 1, wherein encapsulating the fabricated semiconductor structures in a binder material matrix comprises depositing a film layer on a top surface of the templated oxide layer, wherein the film layer comprises the binder material matrix and wherein the film layer conformably fills gaps between grown semiconductor structures at and above the top surface of the oxide layer.

4. The method according to claim 3, wherein releasing the fabricated semiconductor structures from the substrate comprises separating the film layer and the grown semiconductor structures from the oxide layer at or near a location where the film layer contacts a top surface of the oxide layer to provide a set of semiconductor structures embedded in the film layer.

5. The method according to claim 1, wherein semiconductor structures comprise vertically aligned wire arrays.

6. The method according to claim 1, wherein the binder material matrix comprises a polymer.

7. The method according to claim 1, wherein the catalyst comprises gold, copper, nickel or some combination thereof.

8. The method according to claim 2, wherein additionally conditioning the substrate comprises mechanically polishing the substrate.

* * * * *

UNITED STATES PATENT AND TRADEMARK OFFICE
CERTIFICATE OF CORRECTION

| | | |
|---|---|---|
| PATENT NO. | : 8,222,123 B2 | Page 1 of 1 |
| APPLICATION NO. | : 13/053090 | |
| DATED | : July 17, 2012 | |
| INVENTOR(S) | : Joshua M. Spurgeon et al. | |

It is certified that error appears in the above-identified patent and that said Letters Patent is hereby corrected as shown below:

In Column 1, lines 22-24, please delete "The U.S. Government has certain rights in this invention pursuant to Grant No. DE-FG02-03ER15483 awarded by DOE." and insert --This invention was made with government support under Grant No. DE-FG02-03ER15483 awarded by DOE. The government has certain rights in the invention.--

Signed and Sealed this
Fourteenth Day of August, 2012

David J. Kappos
*Director of the United States Patent and Trademark Office*